United States Patent
Meierling et al.

(10) Patent No.: US 9,285,837 B2
(45) Date of Patent: Mar. 15, 2016

(54) TEMPORARY KEYBOARD HAVING SOME INDIVIDUAL KEYS THAT PROVIDE VARYING LEVELS OF CAPACITIVE COUPLING TO A TOUCH-SENSITIVE DISPLAY

(75) Inventors: Klaus-Dieter Meierling, Bochum (DE); Wolfgang Michael Theimer, Bochum (DE); Günther Heinrich Burghardt, Bochum (DE); Heinz Henning Taschke, Bochum (DE); Frank Von Heimburg, Bochum (DE)

(73) Assignee: BlackBerry Limited, Waterloo, Ontario (CA)

(*) Notice: Subject to any disclaimer, the term of this patent is extended or adjusted under 35 U.S.C. 154(b) by 0 days.

(21) Appl. No.: 13/593,886

(22) Filed: Aug. 24, 2012

(65) Prior Publication Data

US 2014/0055363 A1    Feb. 27, 2014

(51) Int. Cl.
*G06F 3/02*     (2006.01)
*G06F 1/16*     (2006.01)
*G06F 3/039*    (2013.01)
(Continued)

(52) U.S. Cl.
CPC .............. *G06F 1/1662* (2013.01); *G06F 3/039* (2013.01); *G06F 3/044* (2013.01); *H03K 17/9622* (2013.01); *G06F 2203/04809* (2013.01); *H03K 2217/96031* (2013.01);
(Continued)

(58) Field of Classification Search
CPC ....... G06F 3/02; G06F 3/0227; G06F 1/1662; G06F 3/039; G06F 3/044; G06F 2203/04809; H03K 17/9622; H03K 2217/96031; H03K 2217/96054; H03K 2217/960755; H03K 2217/96079
USPC .................................................. 345/156–178
See application file for complete search history.

(56) References Cited

U.S. PATENT DOCUMENTS 7,808,488 B2 * 10/2010 Martin et al. ................. 345/169
7,928,963 B2 *  4/2011 Chang et al. ................. 345/169
(Continued)

FOREIGN PATENT DOCUMENTS

EP    1202156      *  5/2002  ............. G06F 3/033
EP    1202156 A2      5/2002

OTHER PUBLICATIONS

Extended European Search Report from related European Patent Application No. 12181765.4 dated Dec. 5, 2012; 7 pages.
(Continued)

*Primary Examiner* — Andrew Sasinowski
(74) *Attorney, Agent, or Firm* — Thomas Grzesik; Fleit Gibbons Gutman Bongini & Bianco P.L.

(57) ABSTRACT

A physical keyboard having a plurality of individual keys temporarily overlays a touch-sensitive display. Each individual key selectively provides either of a first level of capacitive coupling and a second, different level of capacitive coupling to the touch-sensitive display. By one approach the key provides that first level of capacitive coupling to the touch-sensitive display when a user asserts the key (for example, by pressing upon the key) to thereby communicate to the touch-sensitive display a selection of that individual key. The key can provide that second level of capacitive coupling when a user touches, but does not assert, the individual key. So configured, this second level of capacitive coupling serves to communicate to the touch-sensitive display an input instruction other than a selection of that individual key.

14 Claims, 3 Drawing Sheets

(51) Int. Cl.
*G06F 3/044* (2006.01)
*H03K 17/96* (2006.01)

(52) U.S. Cl.
CPC ............... *H03K 2217/96054* (2013.01); *H03K 2217/96079* (2013.01); *H03K 2217/960755* (2013.01)

(56) References Cited

U.S. PATENT DOCUMENTS

2010/0302168 A1* 12/2010 Giancarlo et al. ............ 345/169
2010/0328251 A1* 12/2010 Sinclair ........................ 345/174
2011/0006991 A1* 1/2011 Elias ............................ 345/168
2011/0181514 A1 7/2011 Aboulhosn
2011/0260976 A1 10/2011 Larsen et al.

OTHER PUBLICATIONS

Canadian Office Action from related Canadian Patent Application No. 2,824,594 dated Sep. 8, 2014; 4 pages.
Canadian Office Action dated Apr. 16, 2015 received for Canadian Application No. 2,824,595.

* cited by examiner

TEMPORARY KEYBOARD HAVING SOME INDIVIDUAL KEYS THAT PROVIDE VARYING LEVELS OF CAPACITIVE COUPLING TO A TOUCH-SENSITIVE DISPLAY

FIELD OF TECHNOLOGY

The present disclosure relates to electronic devices that include a touch-sensitive display and more particularly to physical keyboards that temporarily overlay such a display.

BACKGROUND

Electronic devices, including portable electronic devices, have gained widespread use and may provide a variety of functions including, for example, telephonic, electronic messaging and other personal information manager (PIM) application functions. Portable electronic devices include, for example, several types of mobile stations such as simple cellular telephones, so-called smart telephones, wireless personal digital assistants (PDAs), and laptop and tablet-style computers with wireless capabilities. Some electronic devices have an integral physical keyboard comprised of individual keys that a user employs to enter, for example, alphanumeric content such as text.

Portable electronic devices such as PDAs or smart telephones are generally intended for handheld use and ease of portability. Smaller devices are generally desirable for portability. A touch-sensitive display, also known as a touch-screen display, is particularly useful on handheld devices, which are small and have limited space for user input and output. Many such devices can selectively display a so-called virtual keyboard on a touch-sensitive display that a user can employ to again enter alphanumeric content.

Many users prefer a physical keyboard as compared to a virtual keyboard. As one approach to meeting this preference, physical keyboards that temporarily overlay the touch-sensitive display are known in the art. Known approaches in these regards, however, tend to serve only the singular purpose of facilitating the entry of alphanumeric content.

DETAILED DESCRIPTION

Figure 1:
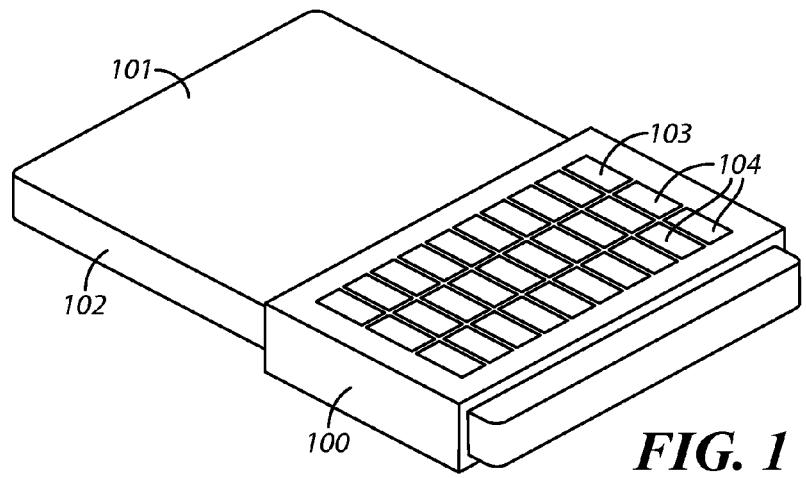
FIG. 1 is a perspective view in accordance with the disclosure.

The following describes an apparatus to be used with a device having a touch-sensitive display (such as, but not limited to, a personal electronics device such as a personal wireless communications device). This apparatus includes a physical keyboard configured to temporarily overlay the touch-sensitive display. This physical keyboard has a plurality of individual keys that each have a corresponding keycap. These individual keys are configured such that each individual key selectively provides a first level of capacitive coupling to the touch-sensitive display and a second level of capacitive coupling to that touch-sensitive display. These two levels of capacitive coupling are different from one another.

By one approach the key provides that first level of capacitive coupling to the touch-sensitive display when a user asserts the key to thereby communicate to the touch-sensitive display a selection of that individual key. This can comprise, for example, pressing upon the individual key to thereby momentarily collapse a corresponding dome switch.

By one approach the key provides that second level of capacitive coupling when a user touches, but does not assert, the individual key. So configured, this second level of capacitive coupling serves to communicate to the touch-sensitive display an input instruction other than a selection of that individual key.

To be clear, both the first level of capacitive coupling and the second level of capacitive coupling are different from one another and are also both different from a quiescent level of capacitive coupling that may exist when the user neither touches nor asserts a key.

So configured, a user can, for example, assert specific individual keys to thereby enter associated alphanumeric content and can also move a displayed cursor by moving a fingertip about the surface of the keycaps without actually pressing down on any of the keycaps to actually assert any of those keys. This approach, in turn, permits the temporarily-placed physical keyboard to simultaneously serve in at least two distinct user-interface modalities. This dual (or greater) function capability, in turn, can greatly leverage the usability and value of such a temporarily-disposed keyboard.

These teachings are highly flexible in practice and can be employed, for example, with a wide variety of keyboard types and formats. These teachings are also highly scalable and can be employed in conjunction with keyboards from only a few individual keys to a great number of individual keys.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

FIG. 1 presents the apparatus 100 as temporarily overlaid on a touch-screen display 101 as comprises a part of a corresponding portable electronics device 102 (such as, but not limited to, a portable communications device).

Figure 2:
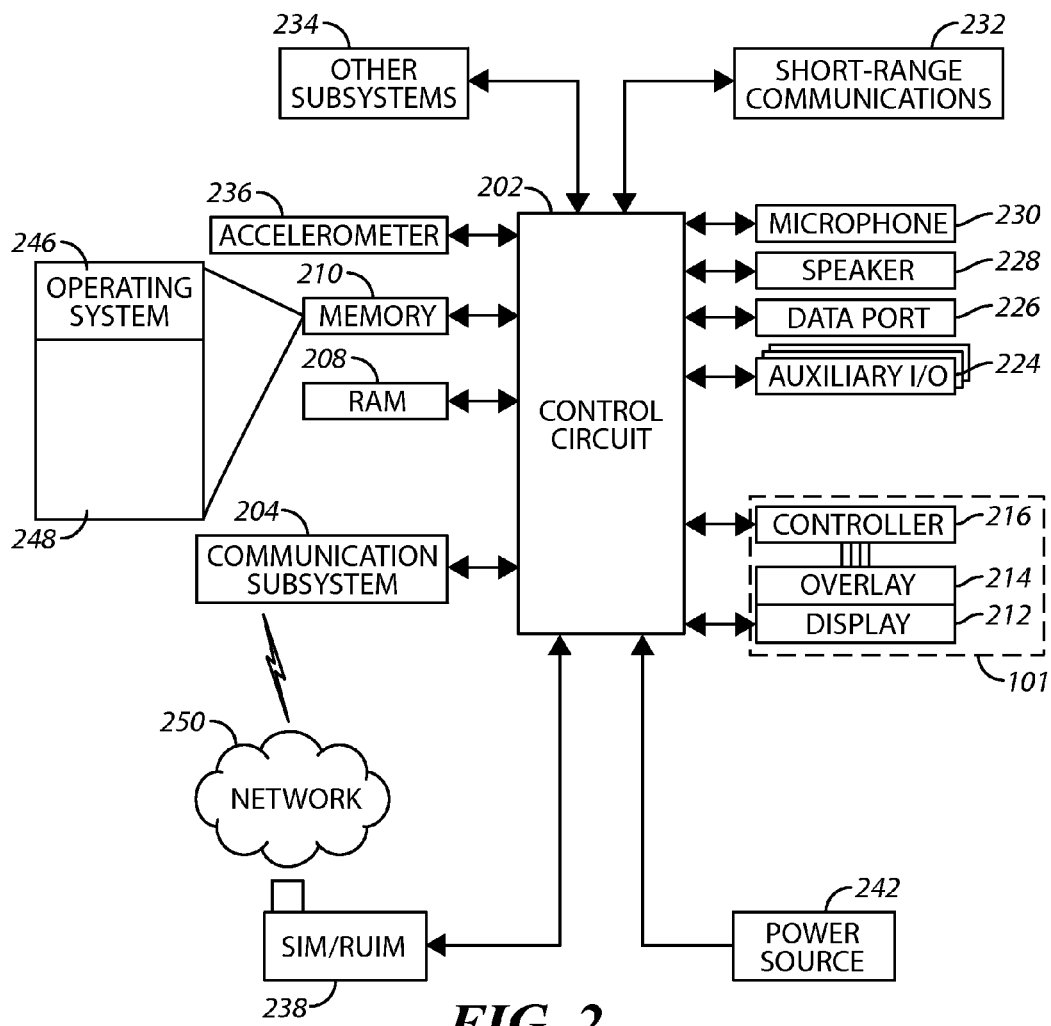
FIG. 2 is a block diagram in accordance with the disclosure.

With momentary reference to FIG. 2, and without intending any particular limitations as regards the described specifics, such a portable communications device can include a control circuit 202 that controls the overall operation of the device.

Communication functions, including data and voice communications, are performed through a communication subsystem 204. The communication subsystem receives messages from and sends messages to a wireless network 250. The wireless network 250 may be any type of wireless network, including, but not limited to, data wireless networks, voice wireless networks, and networks that support both voice and data communications. To identify a subscriber for network access, the portable electronic device may utilize a Subscriber Identity Module or a Removable User Identity Module (SIM/RUIM) card 238 for communication with a network, such as the wireless network 250. Alternatively, user identification information may be programmed into a memory 210.

A power source 242, such as one or more rechargeable batteries or a port to an external power supply, powers the electronic device.

The control circuit 202 interacts with other elements, such as Random Access Memory (RAM) 208, the aforementioned memory 210, a display 212 with a capacitive touch-sensitive overlay 214 (which overlay 214 may comprise, for example, an assembly of multiple layers in a stack including, for example, a substrate, a ground shield layer, a barrier layer, one or more capacitive touch sensor layers separated by a substrate or other barrier, and a cover, and where the capacitive touch sensor layers may comprise any suitable material, such as indium tin oxide (ITO)) operably coupled to an electronic controller 216 that together comprise the aforementioned touch-sensitive display 101, an auxiliary input/output (I/O) subsystem 224, a data port 226, a speaker 228, a microphone 230, a short-range communication subsystem 232, and other device subsystems 234 of choice.

The portable electronic device includes an operating system 246 and software programs, applications, or components 248 that are executed by the control circuit 202 and are typically stored in a persistent, updatable store such as the memory 210. Additional applications or programs may be loaded onto the portable electronic device through the wireless network 250, the auxiliary I/O subsystem 224, the data port 226, the short-range communications subsystem 232, or any other suitable subsystem 234. The memory 210 may comprise a non-transitory storage media that stores executable code, which, when executed, causes one or more of functions or actions as described herein.

In this illustrative example user input can be provided via a graphical user interface using the touch-sensitive overlay 214. The control circuit 202 interacts with the touch-sensitive overlay 214 via the electronic controller 216. Information, such as text, characters, symbols, images, icons, and other items that may be displayed or rendered on a portable electronic device, is displayed on the touch-sensitive display 101 via the control circuit 202.

If desired, the control circuit 202 may interact with an accelerometer 236 that may be utilized to detect direction of gravitational forces or gravity-induced reaction forces.

Notwithstanding the foregoing, however, this device lacks a physical keyboard. In some cases this can comprise lacking any kind of physical keyboard whatsoever. In other cases the device may include a physical keyboard that is wanting in some regard. For example, the included physical keyboard may have an insufficient number or variety of keys (as when the included physical keyboard includes three keys that provide soft functionality but the device otherwise lacks, say, a full standard QWERTY-style keyboard).

Referring again to FIG. 1, the apparatus 100 includes a keyboard 103 that includes a plurality of individual keys that each have a corresponding keycap 104. These keycaps 104 are presented here in a schematic representation. It will accordingly be understood that the keycaps 104 can be as similar or dissimilar to one another as may be wished and that the number of keycaps 104 (in total and/or per row or column) can vary as well as desired. For the sake of example but without intending any specific limitations in these regards this description presumes that the keyboard 103 comprises a QWERTY keyboard as is well known in the art.

By one approach the apparatus 100 can simply lie atop the display 101 during use. For many application settings, however, it may be desirable to temporarily affix the apparatus 100 in place with respect to the display 101. As used herein, this reference to "temporary" will be understood to refer to an anticipated usage timeframe that is considerably less than the operating lifetime of the device 102 itself and to an application setting where the apparatus 100 is designed to be readily installed by a user to support momentary use and to be readily removed by the user upon concluding that momentary use. This is not to say, however, that a given user could not choose to leave the apparatus 100 in its installed position for an extended period of time. (Headphones are an illustrative example in these regards in that the headphones are properly viewed as being temporarily attached to an audio playback device via a corresponding jack connector notwithstanding that a given user might leave the headphones so connected for a long period of time.)

Figure 3:
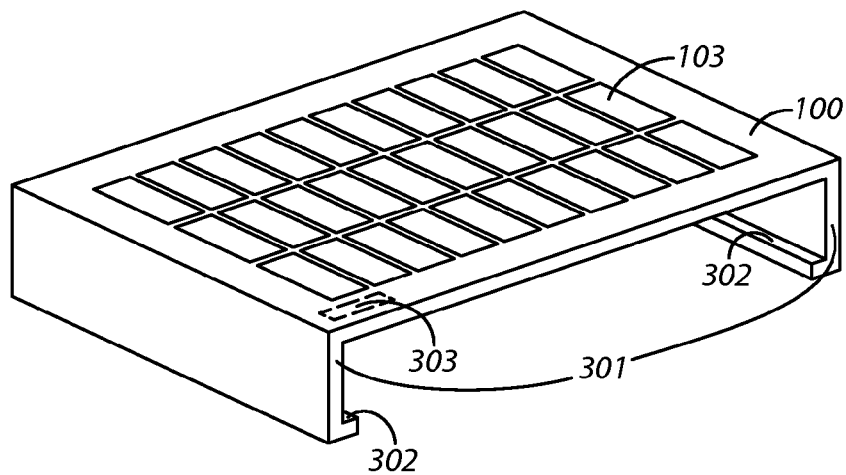
FIG. 3 is a perspective view in accordance with the disclosure.

Referring to FIG. 3, in this illustrative example the apparatus 100 includes a pair of opposing attachment members 301 that extend in an opposite direction from the keycaps 104 and which include a snap-fit arm 302 sized and configured to captivate the portable electronics device 102. The apparatus 100, including the attachment members 301, can be comprised of any suitable material. Materials such as any of a variety of plastics that are both somewhat flexible yet resilient can be particularly useful to provide a reliable snap fit. So configured, for example, the apparatus 100 can be slid over and thereby disposed about the portable electronics device 102 to properly (albeit temporarily) place and affix the apparatus 100 (and hence the keyboard 103) with respect to the touch-sensitive display 101.

If desired, the apparatus 100 can further include at least one physical keyboard identifier 303. This physical keyboard identifier 303 can comprise, for example, a magnet that is very specifically located with respect to the keyboard 103. As another example the physical keyboard identifier 303 could comprise an inwardly-facing light source (such as a light-emitting diode or a cross-section of an optical fiber). As yet further examples the physical keyboard identifier 303 could comprise any of a variety of radio-frequency identification tags or any of a variety of optical codes including 1-dimensional codes (such as the ubiquitous bar code) and 2-dimensional codes (such as the well-known QR code).

This physical keyboard identifier 303 is configured to communicate with the portable electronics device 102. In particular, this physical keyboard identifier 303 conveys information regarding a configuration of the physical keyboard 103 (such as the location of specific keycaps 104, their relative spacing, and the informational content (such as specific alphanumerical characters) that correspond to each such keycap 104). The portable electronics device 102 can then, in turn, use this information to map asserted keycaps 104 as sensed by the touch-sensitive display 101 to particular inputted characters.

By one approach the portable electronics device 102 already has local access to such mapping information. By another approach, the physical keyboard identifier 303 comprises an address (such as, but not limited to, a Uniform Resource Locator (URL)) that the portable electronics device 102 employs to obtain the appropriate configuration information from, for example, a remote server. This can comprise, for example, receiving the address from the physical keyboard identifier 303 and then establishing contact with a remote resource via that address to then obtain the configuration information.

Figure 4:
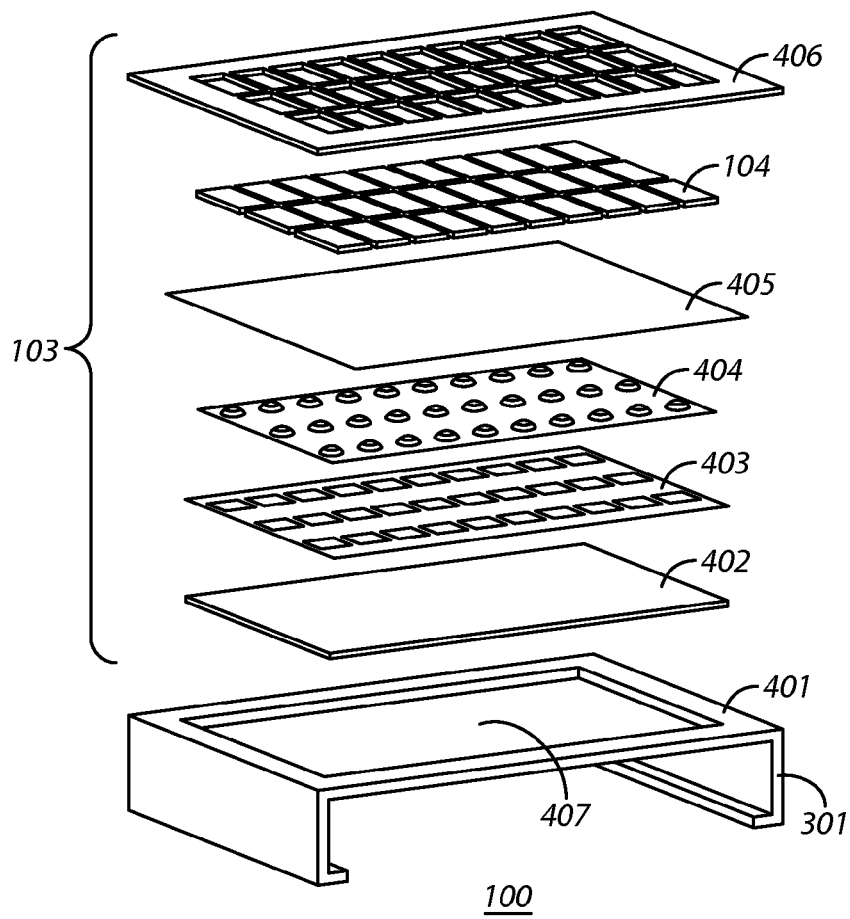
FIG. 4 is an exploded perspective view in accordance with the disclosure.

FIG. 4 presents a more-detailed view of the keyboard 103 in this example. Again, no particular limitations are intended by virtue of the specifics of this example.

In this example the apparatus 100 includes a housing 401 that includes the aforementioned attachment members 301.

This housing 401 includes an opening 407 disposed therethrough to receive keyboard components.

In this example the keyboard 103 includes a light-guide foil 402. Such light-guide foils are well known in the art and find common application with keyboards to facilitate illuminating desired portions of, for example, the keyboard's keycaps. Such light-guide foils can be used in conjunction with side-firing light-emitting diodes (not shown) if desired. In the present application setting, to avoid the use of a portable electrical power supply this light-guide foil 402 can instead be configured to guide light being emitted by the touch-sensitive display 101 in service of desired keyboard illumination.

In this example a foil 403 of conductive patches overlies the aforementioned light-guide foil 402. In this example these conductive patches may be electrically connected to ground (not shown) via corresponding conductive traces (not shown) in accordance with well-understood practice in these regards. Further details regarding these conductive patches are provided below where appropriate.

A dome sheet 404, in turn, overlies the foil 403 of conductive patches with a single dome overlying in registration with a given corresponding conductive patch. These domes are electrically isolated from one another and are formed of flexible yet resilient electrically-conductive material. So configured, such domes will momentarily deform and bend inwardly in response to the pressure of a user's finger and physically contact the corresponding conductive patch. When the user releases that pressure, the dome returns to its previous non-deformed state and hence breaks that contact with the conductive patch. Such dome sheets are again well understood in the art and require no further elaboration here.

In this example a silicone and/or thermoplastic polyurethane (TPU) foil 405 overlies the dome sheet 404. The use of such a foil 405 to provide a desired keyboard feel is also well understood in the art. Accordingly, for the sake of brevity further details in these regards are not provided here.

The aforementioned keycaps 104 overlie the silicone/TPU foil 405 and a corresponding grid 406 serves to maintain each keycap 104 in a proper location (with respect, for example, to the underlying domes and conductive patches).

Figure 5:
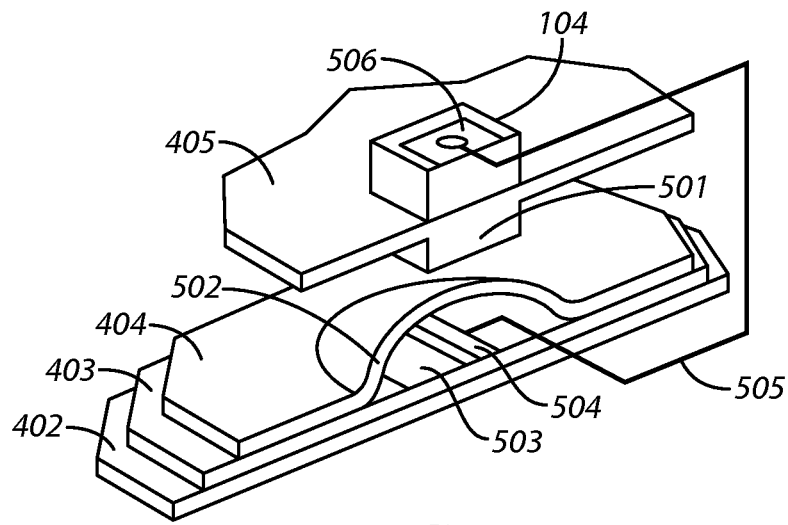
FIG. 5 is a sectioned detail schematic view in accordance with the disclosure.

So configured, and referring now to FIG. 5, each keycap 104 can be individually physically pressed inwardly by a user to thereby cause a corresponding one of the domes 502 to momentarily deflect and contact an underlying conductive patch 503. In this illustrated example the aforementioned silicone/TPU foil 405 includes a protrusion 501 that underlies the keycap 104 and hence helps to communicate the movement of the keycap 104 to the dome 502.

When the foregoing occurs, the electrical capacitance local to this particular individual key assembly changes. The capacitively-sensitive touch-sensitive display 101, in turn, detects this chance in capacitance. By correlating the location of the display 101 where the change in capacitance is detected to a corresponding keyboard map the portable electronic device can identify the asserted keycap 104 and process the input accordingly. Generally speaking, the foregoing approach to detecting an asserted keycap is known. As the present teachings are not overly sensitive to any particular specific details regarding a given implementation, further elaboration in these regards will not be provided here for the sake of simplicity and clarity.

In this particular example a second, smaller electrically-conductive patch 504 also underlies the dome 502. This second conductive patch 504 electrically connects via a corresponding electrical conductor 505 to an electrically-conductive element 506 on the surface (or, if desired, near the surface) of the keycap 104. So configured, pressing this keycap 104 provides a first level of capacitive coupling to the touch-sensitive display 101 and this first level of capacitive coupling, when sensed by the touch-sensitive display 101, permits the display 101 to identify a particular entered alphanumeric character. By merely touching this keycap 104, however, without actually pressing that keycap 104 to thereby cause the corresponding deflection of the associated dome 502, provides in turn a second level of capacitive coupling to the touch-sensitive display 101.

By one approach, this second level of capacitive coupling is less than the first level of capacitive coupling and hence provides a ready mechanism by which the display 101 can distinguish between the two. Accordingly, by touching (without asserting) a given keycap 104 the user can thereby communicate to the touch-sensitive display 101 an input instruction other than a selection of that particular key. Such an approach can serve, for example, to detect a user's sideways-sliding gesture across the surfaces of many adjacent keycaps 104. The portable electronic device, in turn, can translate such a sliding gesture into a corresponding movement of a cursor displayed on the touch-sensitive display 101, the turning of a page in an active web browser application, and/or the scrolling to a "next" email in an active email application, for example.

Depending upon, for example, the size of the aforementioned electrically-conductive element 506, the second level of capacitive coupling can itself vary within some given range (depending, for example, upon how much of the electrically-conductive element 506 the user actually contacts at a given moment). Depending upon the sizes of the keycaps 104, it is possible that the user might actually simultaneously physically touch, at least to some extent, the electrically-conductive elements 506 for a plurality of keycaps 104. Since the corresponding capacitive coupling for each touched keycap 104 can vary within some range as a function, at least in part, of an extent to which a given electrically-conductive element 506 is touched, the portable electronic device can use these various different detected capacitances to determine an effective central keycap 104 of those keycaps 104 that are being simultaneously touched. Such an approach can serve to help identify the particular specific keycap 104 that the user is primarily seeking to touch.

Beyond this, if desired a touchscreen-based position estimate can also be based upon determining that a user's fingertip is located between two adjacent keys. In such a case there will be capacitive readings from all surrounding keys and the control circuit 202 can make an appropriate interpolation to detect that in-between finger position as can occur when the user's finger swipes over a number of such keycaps.

Figure 6:
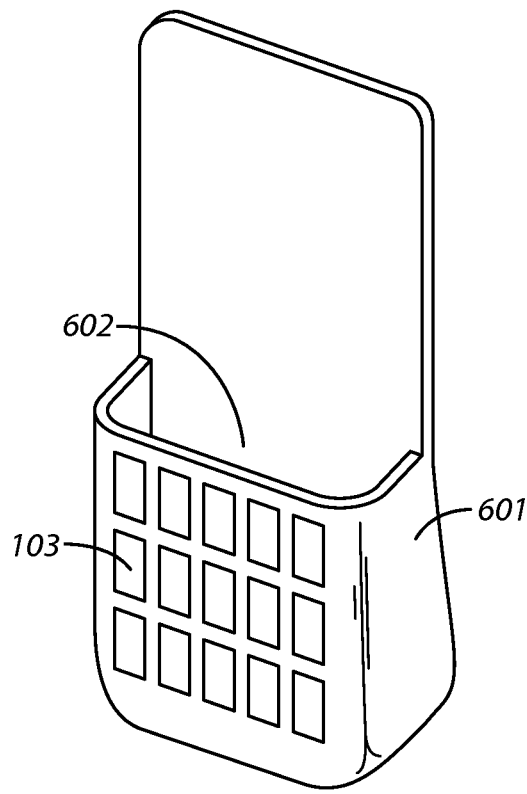
FIG. 6 is a perspective view in accordance with the disclosure.

These teachings are highly flexible in practice and can be readily expressed and leveraged in any of a variety of application settings. As one simple example in these regards, FIG. 6 illustrates that the aforementioned keyboard 103 can comprise a part of a case 601 having a pocket 602 configured to conformally receive at least a portion of a given portable electronic device's touch-sensitive display.

By providing a keyboard where the various keys each provide any of a plurality of different capacitive signatures, a user can, for example, assert given keys to thereby enter associated alphanumeric content while also being able to move a displayed cursor by moving a fingertip about the surface of the keycaps without actually pressing down on any of the keycaps. This approach, in turn, permits the keyboard to simultaneously serve in at least two distinct user-interface modalities.

The present disclosure may be embodied in other specific forms without departing from its essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

We claim:

1. An apparatus for use with a touch-sensitive display, the apparatus comprising:
    a physical keyboard configured to temporarily overlay the touch-sensitive display and comprising a plurality of individual keys, each of the plurality of individual keys comprising a keycap, wherein the plurality of individual keys are configured such that:
        each individual key provides a first level of capacitive coupling to the touch-sensitive display when a user depresses an individual key to thereby communicate to the touch-sensitive display a selection of that individual key; and
        each individual key provides a second level of capacitive coupling to the touch-sensitive display when a user touches but does not depress the individual key to thereby communicate to the touch-sensitive display an input instruction other than a selection of that individual key, the input instruction comprising a user's sideways-sliding gesture across the keycaps of many adjacent ones of the plurality of individual keys, the user's sideways-sliding gesture generating the second level of capacitive coupling at each of the many adjacent ones of the plurality of individual keys,
        wherein the second level of capacitive coupling is different from the first level of capacitive coupling.

2. The apparatus of claim 1 wherein the touch-sensitive display comprises a part of a portable electronics device.

3. The apparatus of claim 2 wherein the portable electronics device comprises a portable communications device.

4. The apparatus of claim 1 wherein the touch-sensitive display comprises a capacitively-sensitive touch-sensitive display.

5. The apparatus of claim 1 wherein the physical keyboard comprises, at least in part, a QWERTY keyboard.

6. The apparatus of claim 1 wherein the second level of capacitive coupling is less than the first level of capacitive coupling.

7. The apparatus of claim 1 wherein each of the individual keys corresponds to a separate dome switch.

8. The apparatus of claim 1 further comprising:
    at least one attachment member configured to physical attach the physical keyboard in an overlying position over the touch-sensitive display.

9. The apparatus of claim 8 wherein the attachment member comprises a snap-fit arm that captivates an apparatus that comprises the touch-sensitive display.

10. The apparatus of claim 1 further comprising:
    a case configured to selectively contain the touch-screen display and wherein the case includes the physical keyboard.

11. The apparatus of claim 1 further comprising:
    a physical keyboard identifier configured to communicate to an apparatus that includes the touch-sensitive display information regarding a configuration of the physical keyboard such that the apparatus that includes the touch-sensitive display can properly correlate a user's interaction with the physical keyboard with corresponding specific inputs.

12. The apparatus of claim 11 wherein the information comprises an address that the apparatus that includes the touch-sensitive display uses to obtain the configuration information.

13. The apparatus of claim 12 wherein the address comprises a Uniform Resource Locator (URL).

14. The apparatus of claim 1, further comprising:
    a first conductive patch underlying each of a plurality of dome switches each corresponding to at least one of the keycaps, wherein the first conductive patch is configured to generate the first level of capacitive coupling based on a keycap being depressed and a corresponding dome switch contacting the first conductive patch in response to the keycap being depressed; and
    at least a second conductive patch underlying each of the plurality of dome switches, the second conductive patch being coupled to an electrically-conductive element disposed on a surface of the keycap corresponding to each of the plurality of some switches, the second conductive patch configured to generate the second level of capacitive coupling based on the user touching at least one of the keycaps without depressing the keycap.

* * * * *